United States Patent [19]

Gesley

[11] Patent Number: 5,196,707
[45] Date of Patent: Mar. 23, 1993

[54] LOW ABERRATION FIELD EMISSION ELECTRON GUN

[75] Inventor: Mark A. Gesley, Oakland, Calif.

[73] Assignee: Etec Systems, Inc., Hayward, Calif.

[21] Appl. No.: 671,425

[22] Filed: Mar. 4, 1991

[51] Int. Cl.⁵ .......................................... H01J 37/073
[52] U.S. Cl. .................. 250/398; 250/396 R; 250/492.2
[58] Field of Search ................. 250/398, 396 R, 492.2

[56] References Cited

U.S. PATENT DOCUMENTS 4,426,582 1/1984 Orloff et al. ................. 250/396 ML

OTHER PUBLICATIONS

IBM Technical Disclosure Bulletin, vol. 33, No. 9, Feb. 1991, New York, U.S., pp. 270-271; "High-Voltage Three-Element Electrostatic Lens for Field Emission Electron Guns", *abstract*.
Journal of Vacuum Science and Technology: Part B, vol. 7, 6, 1989, New York, pp. 1870-1873; J. Orloff; "Analysis of an Electrostatic Gun with a Schottky Cathode", p. 1870, left column, paragraph, p. 1870, left column, paragraph 4-p. 1871, right column, paragraph 1; FIG. 1.
R. Seeliger in Optik, 4, 258, (1948), "Ein neues Verfahren Zur Bestimmung des Öffnungsfehlers von Electronenlinsen", (A New Method for Determination of Aperture Aberrations of Electron Lenses).
Reed and Imhoff, (J. Sci., Instruments, 1, 859, 1968).
Veneklasen and Siegel, (J. Appl. Phys., 43, 4989, 1972).
Kuroda et al., (J. Appl. Phys., 45, 2336, 1974).
G. H. N. Riddle, (J. Vac. Sci. Technol., 15, 857, 1978).
Orloff and Swanson, (J. Appl. Phys., vol. 50(4), (1979), pp. 2494-2501).

Primary Examiner—Jack I. Berman
Attorney, Agent, or Firm—Skjerven, Morrill, MacPherson, Franklin & Friel

[57] ABSTRACT

A field emission source is used in conjunction with a three element asymmetric lens system to provide an electron gun having greater magnitude beam currents focused on a smaller spot size than has been previously possible for intermediate energy beams. The three element asymmetric lens system has a lower spherical aberration than prior art electrostatic guns and a very low chromatic aberration coefficient, enabling precise focusing of beams with large currents and energy spreads. The electron gun produces high current densities in beam focused on small spot areas, despite the relatively large acceptance angle and energy spread of the source beams.

8 Claims, 5 Drawing Sheets

Source Position and Lens Geometries (mm)

|         | DECEL | ACCEL | (O-S) |
|---------|-------|-------|-------|
| $\tau_0$ | 9    | 9     | 16,21 |
| $\alpha$ | 2    | 3     | 3     |
| $\beta$  | 9    | 3     | 3     |
| $\gamma$ | 9    |       |       |
| $\epsilon$ | 14 | 3     | 3     |
| $\rho$   | 9.5  | 9     | 9     |
| $\phi$   | 8    | 4     | 3     |
| $\phi_1$ | 1.6  | -     | -     |
| $t_1$    | 1.5  | -     | -     |
| $t_2$    | 3    | 3     | 1     |
| $t_3$    | 4    | 4     | 1     |

LOW ABERRATION FIELD EMISSION ELECTRON GUN

BACKGROUND OF THE INVENTION

1. Field of the Invention

The invention relates to charged particle guns, and more particularly to field electron and ionization sources for producing high current, medium energy electron and ion beams with electrostatic lens systems for focusing the beams into small spot areas on a target, particularly for use in lithographic systems for semiconductor manufacturing.

2. Description of the Prior Art

The low-aberration three-electrode electrostatic lens is the most recent development evolving from the well known einzel lens. Beginning with the einzel lens, R. Seeliger in Optik 4, 258 (1948), "Ein neues Verfahren Zur Bestimmung des e,uml/O/ ffnungsfehlers von Electronenlinsen" ("A new method for determination of aperture aberrations of electron lenses") noted that a physically asymmetric inner (focus) electrode lowers spherical aberration.

Reed and Imhoff (J. Sci, Instruments 1, 859, 1968) electrically decoupled the three electrodes of the einzel lens to produce a zoom lens, which allows the use of a variable energy and variable magnification beam to impinge on the target. Equivalently, a variable gun focus is obtained without having to move the object along the axis.

Veneklasen and Siegel (J. Appl. Phys. 43, 4989, 1972) developed a relatively complex einzel lens "preaccelerator" electrode geometry for field emission transmission electron microscopy applications. They noted the use of a high magnification operation can reduce gun aberrations, although the principle is not consistently applied as it is assumed there is a distinction between electrostatic and magnetic lenses. Actually the principle holds in either case, and was first demonstrated experimentally in an election optics application by K.-J. Hanszen in Optik 15, 304 (1958), and is a rediscovery of a well known classical optics result for reducing spherical aberration, see A. Septier, Ad. Opt. Electr. Microscopy issue 1, p. 221.

Kuroda et al. (J. Appl. Phys. 45, 2336, 1974) adopted Reed and Imhoff's results and applied it to develop a lens for field emission scanning electron microscopy. This design reduced the complexity of Veneklasen's preaccelerator while maintaining its functionality.

G.H.N. Riddle in J.Vac.Sci.Technol. 15, 857 (1978) investigated a set of sixteen three-electrode lens geometries for field emission guns. He found that a physically asymmetric focus electrode geometry lowers the spherical aberrations and confirmed Seeliger's original finding that his einzel lens geometry had a small spherical aberration. Riddle also found this design has the lowest chromatic aberration of all the lenses studied. These aberrations are well known to workers in the field. Chromatic aberration contribution to beam diameter is $d_c = C_c \alpha$ where $C_c$ is the chromatic aberration coefficient, $\alpha$ is beam semiangle, $\Delta E$ is the measure of the beam energy distribution, and E is the mean value of the beam energy. The spherical aberration contribution to the beam size is $d_s = \frac{1}{2} C_s \alpha^3$ with $C_s$ the spherical aberration coefficient. Otherwise stated, spherical aberration increases beam size due to variation in focal length with off-axis distance of the beam. Chromatic aberration increases beam size due to the velocity dispersion of the beam.

Orloff and Swanson (U.S. Pat. No. 4,426,582 incorporated herein by reference) used Riddle's low chromatic aberration gun lens as a focusing element for an ion beam microprobe. They also verified the lens' aberration properties using Munro's electron optics computer programs and showed this lens had better performance than either of the two-electrode lenses of Crewe or Munro. Although the Orloff and Swanson patent disclosure is of the use of the three element electrostatic lens, its primary emphasis is on its application in conjunction with a liquid metal ion source. Although the lens is emphasized as having low aberration properties, the reduction in object distance to decrease aberrations is not considered critical by them. Also in their application spherical aberration was not considered the dominant factor and thus they did not consider other measures to reduce this factor contributing to the beam crossover size at the gun image plane. The system of Orloff and Swanson is not therefore suitable for use in a lithography system requiring large currents and submicron beams because of its large aberrations.

Figure 1:
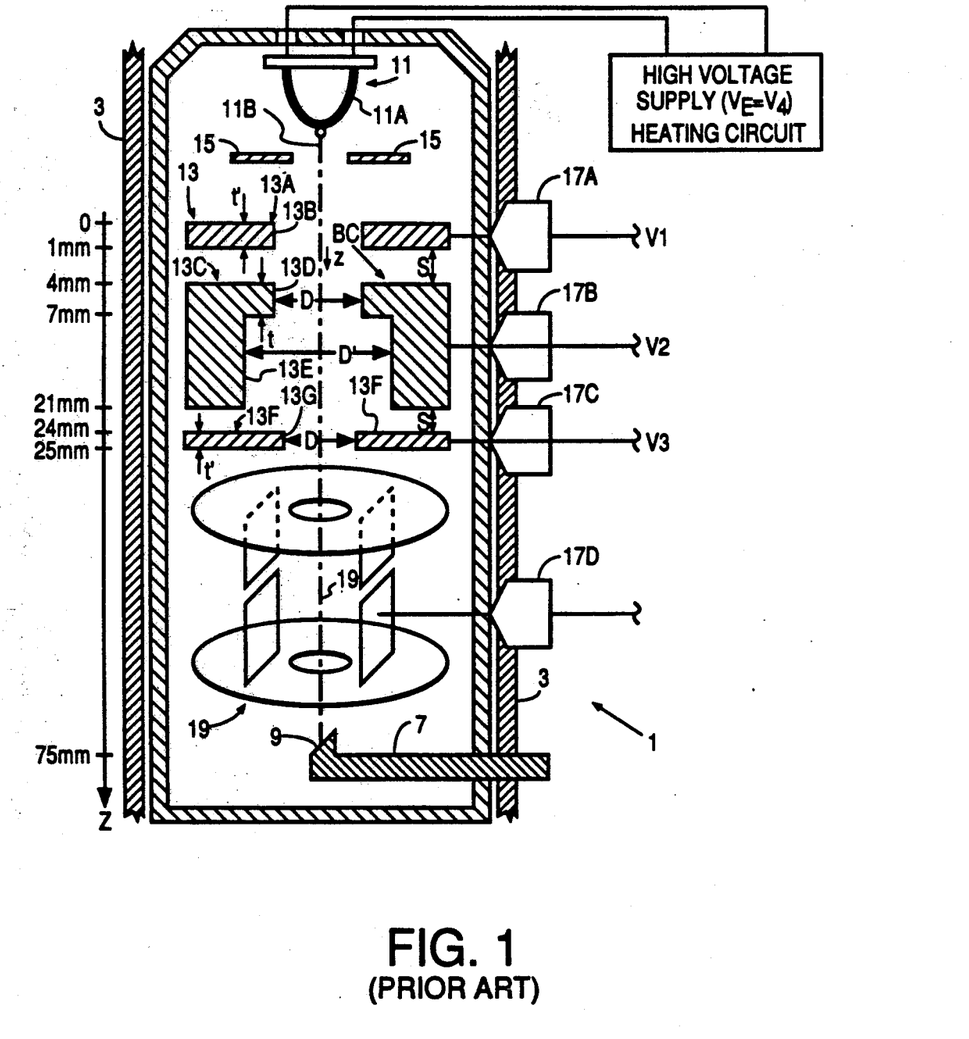
FIG. 1 shows a prior art lens system.

In the above-referenced Orloff and Swanson patent disclosure and their article in J. Appl. Phys. vol.50 (4), (1979) p.2494–2501, the source to object distance is $z_o = 15$ to 20 mm. FIG. 1 of the present application is from the Orloff and Swanson patent disclosure. Ion gun 1 includes a liquid metal field ionization source 11 and electrostatic optical system 13, a deflection system 21, and a target 9.

Field ionization source 11 includes an emitter support 11A, and an emitter 11B. The tungsten field emitter 11B is welded to a tungsten loop 11A to resistively heat the emitter.

The above described elements are supported within a vacuum chamber 5 on support 3. Target 9 is on support 7. Support 7 extends through the wall of a vacuum chamber 5 to permit alignment of target 9 with the beam emitted from emitter 11B and focused by the electrostatic lens system 13. The ion beam is focused generally along dotted line 19 to target 9.

An extractor ring 15 having an opening 15A therein is supported and aligned with emitter 11B immediately below the tip of emitter 11B. Extractor ring 15 is at the same potential as element 13A of electrostatic optical system 13 and physically attached to element 13A.

Asymmetric electrostatic lens system 13 includes top element 13A, center element 13C, and bottom element 13F.

A first element 13A is a disk-shaped conductor having a circular aperture 13B centered about axis 19, and first element 13A is perpendicular to axis 19. Aperture 13B has a diameter D, which is three millimeters. The thickness of first element 13A is t', equal to one millimeter.

A second element 13C is physically asymmetric, and is spaced a distance S from first element 13A, S being three millimeters physical asymmetry results from an aperture of varying size through second element 13C. The upper portion 13D of second element 13C has a thickness t and an aperture diameter of D, t being three millimeters. The lower portion 13E of second element 13C has a thickness of 14 millimeters and an aperture diameter of D', which is 18 millimeters. The ratio of the aperture diameter D' to the thickness of lower portion 13E therefore is 18 millimeters divided by 14 millimeters, or approximately 1.3.

A third element 13F is parallel to first element 13A, and is spaced S millimeters therefrom. Third element 13F has a thickness t' and an aperture diameter of D. First, second and third elements 13A, 13C and 13F are all axially aligned with respect to axis 19.

The distance between the tip of emitter 11B and the plane of the upper surface of top element 13A is 15 millimeters. The distance between the target spot on target 9 and the plane of the upper surface of upper element 13A is 75 millimeters.

Electrostatic deflection system 21 is disposed below third element 13F in FIG. 1 and is axially aligned with axis 19. A voltage $V_E$ is applied to the emitter.

An initial or first voltage V1 is applied to first element 13A by means of feedthrough 17A. Voltage V1 is also applied to extractor ring 15 in the device of FIG. 1. A control voltage V2 is applied to center element 13C by means of feedthrough 17B.

A third or final voltage V3 is applied to bottom element 13F by means of feedthrough 17C. V1, V2 and V3 are all referenced to the voltage $V_E$ of the ionization source 11. V3 is set at ground potential and the final energy of the beam then be determined by $V_E$. The extraction voltage is determined by the difference between $V_E$ and V1. 0 Feedthrough 17D applies suitable voltage to the deflection plates of electrostatic deflection system 21. The commercially available Schottky-SEM electron gun, based on the above-described Orloff and Swanson gun and manufactured by FEI Co., uses $z_o = 20$ mm.

SUMMARY OF THE INVENTION

The main object of the present invention is to increase the beam brightness, current density, and resolution of a field emission electron gun or an ion beam source gun. The method to do so combines a low aberration electrostatic lens with a field emission or ion beam point source. As is well known, field emission cathodes have divergent electron trajectories formed in the initial diode region between the emitter and extractor electrodes, which produces a virtual source for the lens. Such devices are also characterized by their high current emission properties and include heated cathodes whose operation extends into the Schottky regime.

An application of the gun of the present application is as the initial optical element in a multiple lens column for electron beam lithography for fabrication of integrated circuits. Such lithographic applications require relatively large currents, which are focused into submicron areas with small target convergence angles. Small target convergence angles reduce deflection aberrations and increase depth of focus. A large gun aperture is used so that sufficient current can be extracted from the characteristically low angular intensity provided by field emission type sources.

This low angular intensity is related to the small virtual source size formed within the cathode (and the relatively small area of the cathode that contributes usable beam current). To produce higher gun brightness with a large aperture requires proper magnification and reduced lens aberrations. Greater emphasis must be placed on lowering gun aberrations when the column operates near unity magnification, as is the case with submicron electron beam lithography. The gun must also independently control current, focus the beam, and set the beam voltage. In the prior art gun of Orloff and Swanson, the reduction in object distance to decrease aberrations was not considered to be critical. In contrast, such a reduction in object distance is advantageous in accordance with the present invention.

Electrostatic focusing (in contrast to magnetic focussing) minimizes the mechanical complexity of the lens, reduces dissipated heat, and simplifies the optical and mechanical alignment of the lens electrode and beam.

Advantages of the present invention stem from the improved gun brightness. Brightness (expressed in units of AMPS/cm$^2$ steradian) = $i/\pi r^2 \pi \alpha^2$ and is determined by the current (i) focused to a spot with radius (r) and semiangle ($\alpha$). Larger currents are delivered in accordance with the invention in the submicron spot diameter range than was heretofore possible using an electrostatic lens. A smaller target convergence angle reduces beam deflection aberrations and increases depth of focus. Faster, more accurate exposures are possible when the gun is combined with a conventional column for 10 kV electron beam lithography. As a result the exposure of resists with 2.5 $\mu$Coulomb/cm$^2$ sensitivity at a 160 MHz blanking rate in a raster-scan system is made possible by delivering 400 A/cm$^2$ beam current density to the target of a multiple lens column over a spot diameter range of 0.05–0.30 $\mu$m, 0.30 $\mu$m, as well as 250 A/cm$^2$ over a spot diameter range of 0.30–0.50 $\mu$m.

By improving the brightness of the electrostatic gun, the gun meets the high current and high resolution requirements needed by chip and mask lithography for fabricating semiconductors. The relative simplicity of the electrostatic lens is a practical advantage when compared to prior art magnetic focusing. Hence advantages are obtained both optically (with respect to prior art electrostatic lenses) and mechanically (with respect to magnetic lenses) by the invention. The larger spherical aberration of the prior art Orloff and Swanson lens prevents its use in the microlithographic application described above. Only the system in accordance with the present invention has low enough aberrations to provide performance similar to that of a magnetically focused gun in lithographic applications. The mechanical advantages of an electrostatically focused gun-lens are: less complex mechanical design, fewer components, less weight; less power dissipation, current excitation of the magnet that must act as a strong lens is eliminated; ease in including a limiting aperture, which increases current efficiency; and greater ease in alignment.

The lens electrode geometry should yield low aberrations and (a) keep focus voltages under 30 kV so that power supplies with stabilities at 10 ppm can be used and the probability of electrical breakdown is minimal; (b) be conducive to good mechanical alignment, thus reducing distortion and aberrations arising from their misalignment; (c) minimize astigmatism so that practical stigmator strengths can correct for it, this being done by electrostatic shielding of large inter-electrode gaps so as to preserve the rotational symmetry of the electric field, which interacts and focuses the beam; (d) have an aperture that limits total emission current transmitted, which results in high current efficiency, i.e. a large ratio of used to total emitted current, thereby reducing the deleterious effects of charging and beam space charge and energy broadening; (e) produce a gun image on-axis 50–200 mm from the source, while also permitting extraction voltage changes to be made up to 12 kV at a 10 kV beam voltage. The Orloff and Swanson device also meets these conditions but with significantly larger aberrations, and therefore cannot produce as small a spot size with a given current.

Therefore, a unique aspect of this invention is that it provides a significant reduction in electron gun spherical aberration over that of the prior art gun while maintaining a low chromatic aberration compared to the prior art system of Orloff and Swanson. This aspect is achieved by several novel geometric features of the electrode structure and to the location of the lens relative to the electron source. Larger currents are then focused into submicron spots at smaller final angles. Deflection aberrations are reduced and depth of focus is improved for multiple lens columns using this gun. A specific feature is the reduced distance between the electron source (cathode) and the onset of the lens focus field.

Spherical aberration is greatly reduced and low chromatic aberration is maintained in accordance with the invention. Large electrode bores and interelectrode gaps are set to further reduce the aberrations and yet maintain an upper limit on the lens focus voltage. Increases in gun magnification are compensated by a greater reduction in the object-side aberrations. This ultimately reduces the beam crossover size of the gun.

DETAILED DESCRIPTION OF THE INVENTION

Two embodiments of the lens geometry are disclosed herein, each optimized for one of the two focus modes peculiar to the operation of a three element electrostatic lens. Except for the below-described features, in other respects the gun of the present invention is conventional as described above. The ACCEL-gun has lower aberrations but requires high focus voltages. The ACCEL-gun lens geometry produces the smallest beam crossover size, but has an intrinsically high focus voltage. It is constrained to be less than 30 kV at 10 kV beam voltage. The DECEL-gun mode has higher aberrations, but operates at focus voltages under 2 kV.

The gun described in the present application in one embodiment sets a value of $z_o = 8$ mm, which takes maximum advantage of reducing spherical aberration and maintaining a low chromatic aberration by use of a small source object distance. Besides the reduction in source-to-lens position, the present invention further optimizes the lens configuration to reduce aberrations. Thus even if the object distance of the prior art gun disclosed by Orloff and Swanson had been reduced to 8 mm, it would not yield a spot size as small as that of the gun disclosed herein. The lens electrode geometry of the present application is constrained in one embodiment to keep the focus voltage below 30 kV for the ACCEL-gun.

Figure 2:
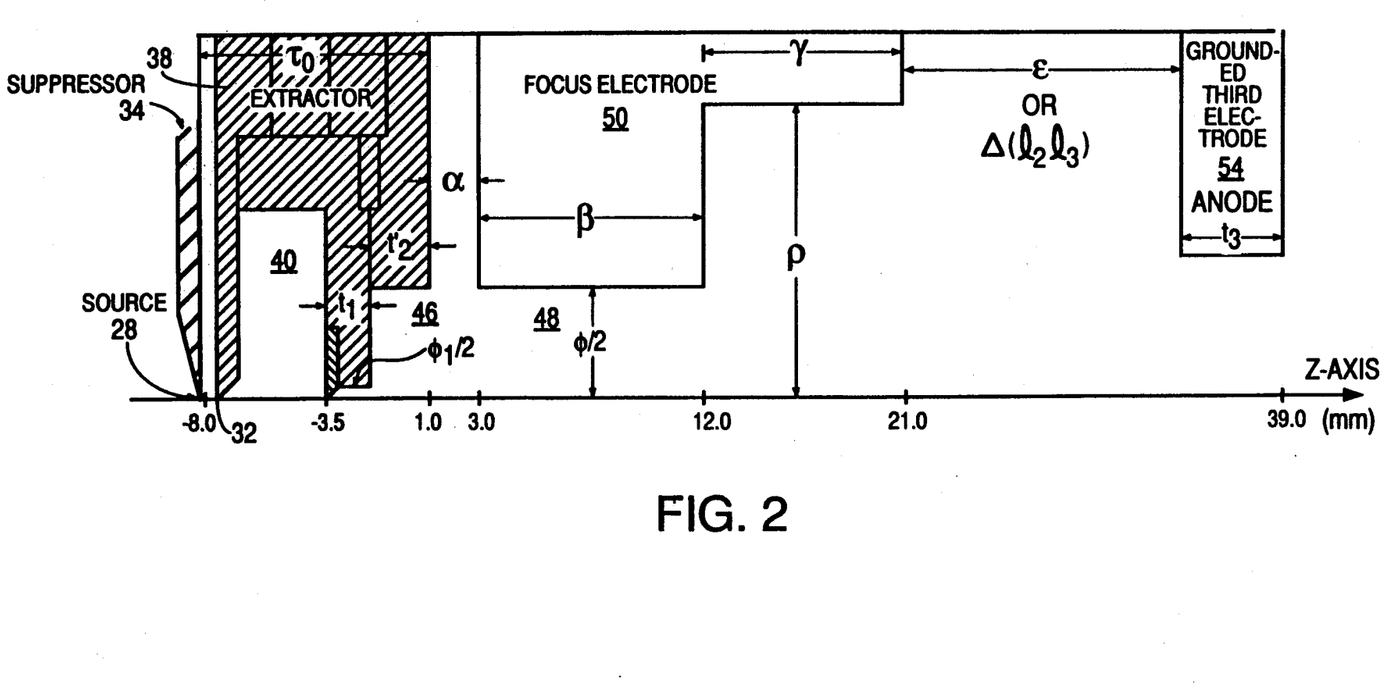
FIGS. 2 and 3a, 3b, 3c show lenses in accordance with the present invention.
Figure 3A:
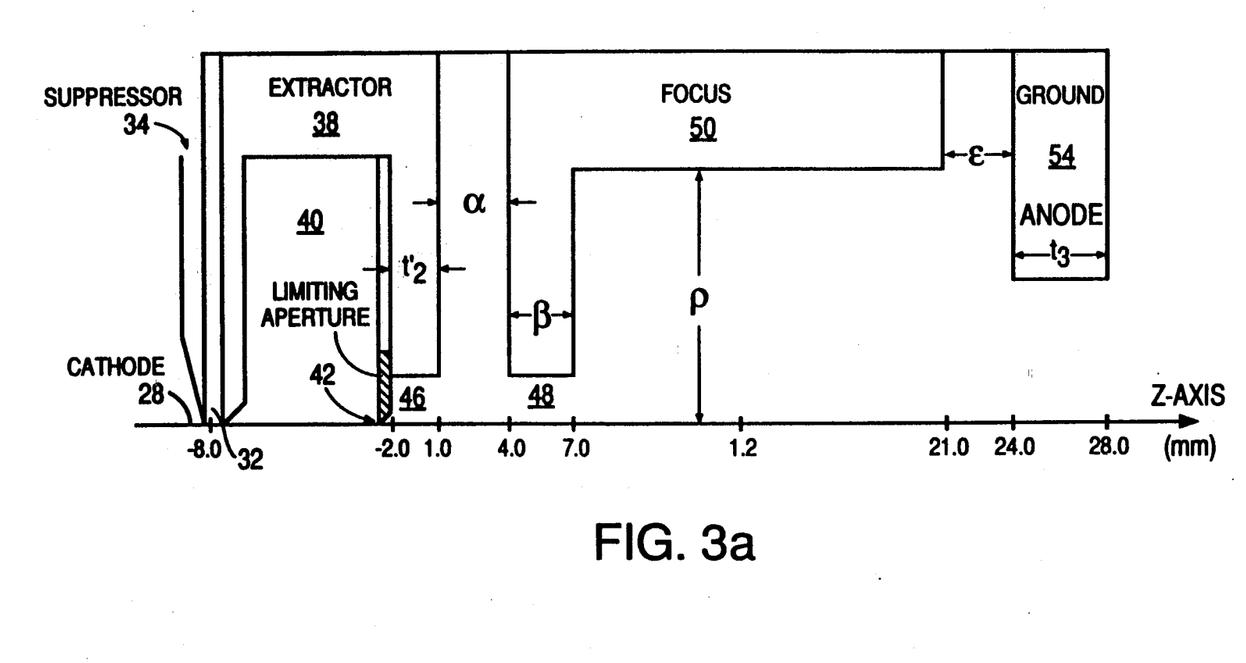
Figure 3B:
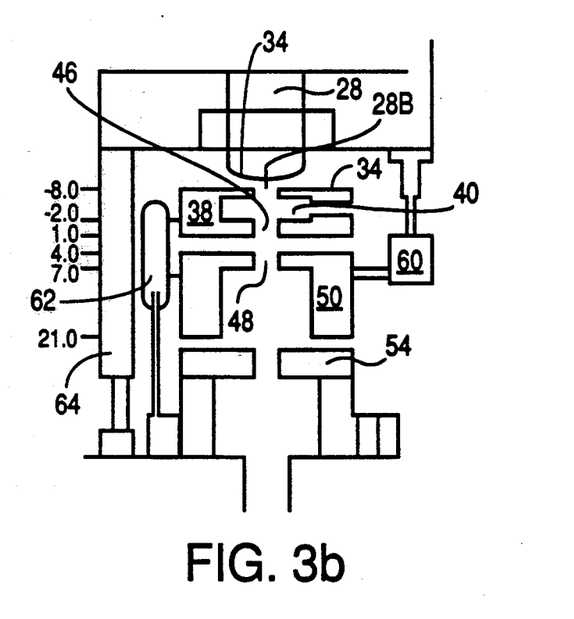
Figure 3C:
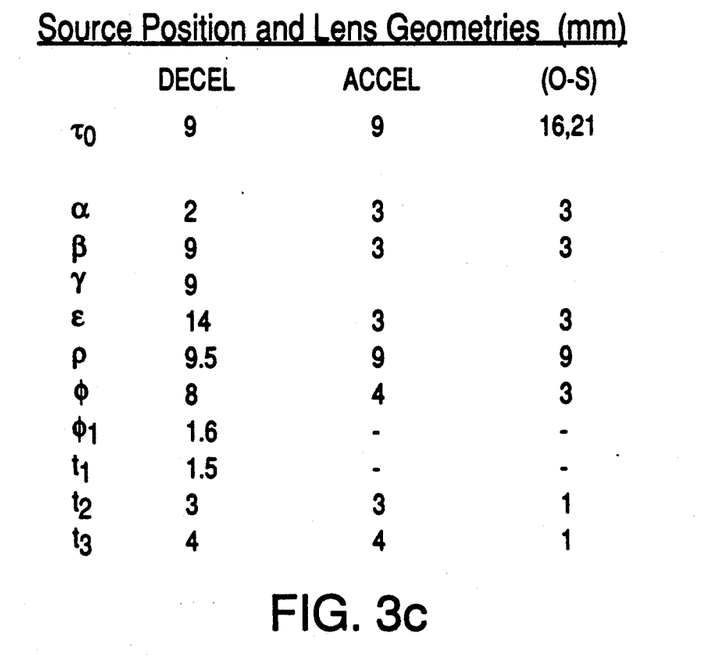

FIG. 2 shows a top-section, side-view along the center line of the rotationally symmetric source-lens geometry for the DECEL-gun. The second embodiment of the lens geometry (termed the ACCEL-gun) is shown in FIG. 3a. A full cross sectional view of the ACCEL gun is shown in FIG. 3b. For any given three-element lens there are typically two focus modes, i.e. two distinct focus voltages that will produce an image at a specified axial distance. The particular mode chosen depends on (i) the need for an absolute minimum in aberrations and (ii) the upper limit in focus voltage that can be tolerated. The DECEL focus mode uses a lower focus voltage than the ACCEL-mode. In both cases the electrode geometry achieves the minimum possible aberrations. Various dimensions of the DECEL and ACCEL guns, and of the prior art Orloff and Swanson gun (O-S) are shown in the table of FIG. 3c with dimensions in mm.

The gun in accordance with the present invention differs from the Orloff and Swanson device: (1) By using a smaller source to focus field distance. We use in one embodiment $Z_O = 8$ mm, while they use $Z_O = 15$ to 20 mm. (2) We have a novel lens electrode geometry. These specific dimensional features are shown in the table in FIG. 3c. In this table $T_O = (Z_O + 1)$ is a measure of the source-to-focus field distance, a key geometrical parameter optimized by this invention.

The ACCEL and DECEL embodiments are two separate lens geometries that minimize aberrations, one for each focus mode. Depending on system requirements, the DECEL lens yields low aberrations with very low focus voltages, whereas the ACCEL lens has even lower aberrations, but with high focus voltages.

In either case the lens has three electrodes (extractor, focus, and grounded anode or final electrode) to provide independent control of three gun functions:

1) beam current, set by the voltage $V_x$ between the cathode and extractor with secondary current control determined by the suppressor-to-source voltage. The extractor voltage $V_x$ typically operates over the range 4 kV to 12 kV, which provides an angular intensity range of $0.1 \leq i_{106}$ (mA/sr) $\leq 1.0$ when using a 1 μm apex radius cathode which is a <100>-oriented tungsten single crystal cathode impregnated with zirconium oxide operating in the Schottky emission regime.

2) z-axial beam placement, set by the focus voltage, with the gun image distance $z_i$ range of 50 to 200 mm.

3) beam voltage, $V_B = 10$ kV.

The guns of both FIGS. 2 and 3a both operate by emitting current from the cathode-source 28B. The cathode 28B is attached to metallic "hairpin" 28 which is used to resistively heat the cathode situated next to the extractor 30. (Identical reference numbers in FIGS. 2a, 3a, 3b refer to similar structures). The high-field initial-diode region is defined by the gap 32 between the source 28B-suppressor 34 assembly and the top-side (upstream end) of the extractor 38. A majority of the emitted electrons travel through the field-free inner recess 40 of the extractor 38 electrode and are stopped by the gun limiting aperture 42 located within. This aperture 42 defines the gun acceptance semiangle $a_o$. To transmit 314 nA of current beyond the gun limiting aperture 42 a 10 mrad semiangle is defined, assuming the source 28B emits 1 mA/steradian. Transmitted electrons enter the first part of the lens focus field.

The extractor 38 configuration downstream of the aperture 42 serves two purposes. First, it shapes the field and thereby reduce aberrations. Second, it provides a final section that can be easily aligned mechanically with the other electrodes (focus and anode) to achieve concentricity and hence reduce aberrations. This is achieved by having the same bore 46 as the entry section 48 of the focus electrode 50. The lens object distance is defined by the source 28B-to-focus field separation. The lens focus field origin $Z_O = 0$ is geometrically defined 1.0 mm behind the extractor 38 exit. The source 28B is situated axially at $Z_o = -8$ mm. The beam passes through the focus electrode 50 and grounded anode electrode 54 and is focussed at a crossover (not shown) determined by the extraction, focus, and beam voltages.

FIG. 3b also shows the conventional support structures 62, 64 respectively supporting the focus and extraction electrodes and supporting the source assembly, comprised of the suppressor and cathode.

The voltage feed-throughs 60, 34, 28 respectively contact the focus electrode, the suppressor, and cathode filament leads which supply the final beam potential to the cathode. The voltage electrode feedthrough for the extractor is not shown.

Figure 4:
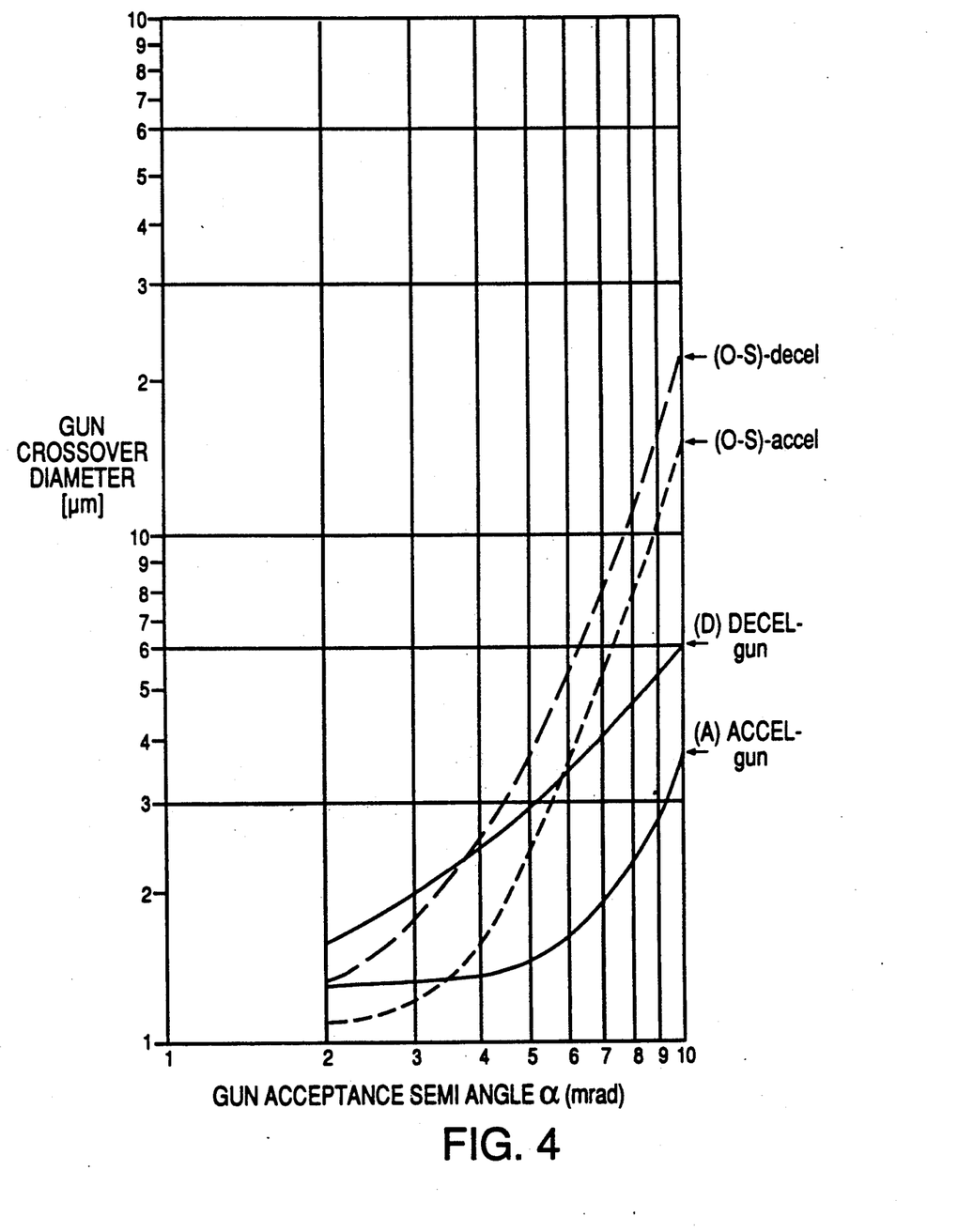
FIG. 4 shows performance of lenses in accordance with the present invention.

FIG. 4 shows a comparison of gun crossover diameters (vertical axis) at 10 kV beam voltage versus gun acceptance semiangle characteristics for the (A) ACCEl-gun, (D) DECEL-gun, (0-S)/a which is the prior art Orloff and Swanson lens operated in the accel focus mode, and (0-S)/d which is the prior art Orloff and Swanson lens operated in the decel mode. The graph shows:

i) the (A)-ACCEL gun has lower aberrations and yields a smaller spot size than does the (D)-DECEL gun. The tradeoff is that for the conditions stated, the (A)-ACCEL gun requires a 26.7 kV ground-based focus voltage to focus the beam, whereas the (D)-DECEL gun only requires a 1.3 kV floating focus voltage referenced to the cathode.

(ii) both the (A)-ACCEL gun and (D)-DECEL gun result in improved performance compared to the (0-S) lens operated in either decel or accel focus modes for aperture angles $\alpha_o \geq 4$ mrad. When considering brightness as a measure, the improvement over the (O-S) lens is even greater. For example, at $\alpha_o = 10$ mrad using a 1 mA/steradian source, 314 nA of current is available. Under these conditions the effective brightness ($B_{co}$) and current density (J) at the crossover for the lenses under comparison are:

(A)-ACCEL gun $B_{co} = 4.7 \times 10^7$ A/cm$^2$sr, J=290 A/cm$^2$ (D)-DECEL gun $B_{co} = 1.3 \times 10^7$ A/cm$^2$sr, J=109 A/cm$^2$ (O-S)-accel mode $B_{co} = 2.0 \times 10^6$ A/cm$^2$sr, J=18 A/cm$^2$ (O-S)-decel mode $B_{co} = 7.8 \times 10^5$ A/cm$^2$sr, J=8 A/cm$^2$ Improved gun brightness is achieved by reduction of source-to-lens distance. The principal benefit is a marked decrease in spherical aberration, beyond the state of the prior art, while maintaining a low chromatic component.

A conventional electrostatic shield (not shown) outside the focus-anode gap is used in the gun in one embodiment to reduce astigmation by maintaining a centrosymmetric electrostatic field. Opening up the inner bore reduces aberrations, but focus voltage increases.

The above description of the invention is illustrative but not limiting; further modifications thereto will be apparent to one of ordinary skill in the art in the light of this disclosure. Particularly, aberrations can be further reduced in the ACCEL-gun if the focus voltage is allowed to increase above the stated 30 kV limit.

I claim:

1. An apparatus for producing a beam of charged particles along an axis and focusing said beam onto a target spot, said apparatus comprising:
    emitter means for emitting said beam along said axis;
    an electrostatic lens system spaced from and disposed about said axis beneath said emitter means for focusing said beam onto said target spot, said electrostatic lens system including:
    (i) a first lens element conducting a first voltage and having therein a first aperture through which said beam passes, said first aperture being centered about said axis;
    (ii) a second lens element conducting a second voltage and including a second aperture through which said beam passes after it leaves said first aperture, said second lens element being spaced from and disposed beneath said first lens element,
    said second aperture having an upper portion which is circular, and is centered about said axis, and has a first diameter,
    said second aperture having a lower portion which is approximately cylindrical, and centered about said axis, and has a second diameter, and has a predetermined thickness in the direction of said axis, said second diameter being greater than said first diameter;
    (iii) a third lens element located below said second aperture and conducting a third voltage and having a third aperture through which said beam passes only after it leaves said second aperture, said third aperture being centered about said axis, the distance between said emitter means and said first lens element being about 8 mm.

2. The device of claim 1, wherein said upper portion of said second lens element extends along said axis about 9 mm.

3. The device of claim 1, where the distance between said second lens element and said third lens element along said axis is about 14 mm.

4. The device of claim 1, wherein said first diameter is about 8 mm.

5. The device of claim 1, wherein said first lens element extends along said axis a distance of about 3 mm.

6. The device of claim 1, wherein said third lens element extends along said axis a distance of about 4 mm.

7. The device of claim 1, wherein said first voltage is less than about t2 kV.

8. An apparatus for producing a beam of charged particles along an axis and focusing said beam onto a target spot, said apparatus comprising:
    emitter means for emitting said beam along said axis;
    an electrostatic lens system spaced from and disposed about said axis beneath said emitter means for focusing said beam onto said target spot, said electrostatic lens system including:
    (i) a first lens element conducting a first voltage and having therein a first aperture through which said beam passes, said first aperture being centered about said axis and extending along said axis about 3 mm;
    (ii) a second lens element conducting a second voltage and including a second aperture through which said beam passes after it leaves said first aperture, said second lens element being spaced from and disposed beneath said first lens element,
    said second aperture having an upper portion extending along said axis about 9 mm and which is circular, and is centered about said axis, and has a first diameter of about 8 mm,
    said second aperture having a lower portion which is approximately cylindrical, and centered about said axis, and has a second diameter, and has a predetermined thickness in the direction of said axis, said second diameter being greater than said first diameter;

(iii) a third lens element located below said second aperture and being about 14 mm from said second lens element along said axis and conducting a third voltage and having a third aperture through which said beam passes only after it leaves said second aperture, said third aperture being centered about said axis and extending along said axis about 4 mm, the distance between said emitter means and said first lens element being about 8 mm.

* * * * *

UNITED STATES PATENT AND TRADEMARK OFFICE
CERTIFICATE OF CORRECTION

PATENT NO. : 5,196,707  Page 1 of 2
DATED : March 23, 1993
INVENTOR(S) : Mark A. Gesley It is certified that error appears in the above-indentified patent and that said Letters Patent is hereby corrected as shown below:

The drawing sheet consisting of Fig. 4, should be deleted to be replaced with the drawing sheet consisting of Fig. 4, as shown on the attached page.

Col. 6, line 32, "106" should read --Ω--.

Signed and Sealed this

Eighteenth Day of January, 1994

Attest:

BRUCE LEHMAN

*Attesting Officer*   *Commissioner of Patents and Trademarks*

FIG. 4